(12) United States Patent  
Inoguchi (10) Patent No.: US 7,531,785 B2
(45) Date of Patent: May 12, 2009

(54) CIRCUIT DEVICE AND METHOD OF MANUFACTURING THE SAME

(75) Inventor: Hiroshi Inoguchi, Gunma (JP)

(73) Assignees: Sanyo Electric Co., Ltd., Osaka (JP); Kanto Sanyo Semiconductors Co., Ltd., Gunma (JP)

( * ) Notice: Subject to any disclaimer, the term of this patent is extended or adjusted under 35 U.S.C. 154(b) by 205 days.

(21) Appl. No.: 11/474,300

(22) Filed: Jun. 23, 2006

(65) Prior Publication Data

US 2007/0001102 A1  Jan. 4, 2007

(30) Foreign Application Priority Data

Jun. 30, 2005 (JP) .............................. 2005-192317

(51) Int. Cl.
*H01L 23/02* (2006.01)
*H01L 29/40* (2006.01)

(52) U.S. Cl. .................... 250/214.1; 257/667; 257/678; 257/680; 257/774; 257/E33.057

(58) Field of Classification Search ............. 250/214.1; 257/667, 774, 666, 676, 678, 680, E33.057, 257/E33.058

See application file for complete search history.

(56) References Cited

U.S. PATENT DOCUMENTS

| 4,399,707 | A | * | 8/1983 | Wamstad | ...................... | 73/727 |
| 5,436,492 | A | * | 7/1995 | Yamanaka | .................. | 257/433 |
| 5,852,320 | A | * | 12/1998 | Ichihashi | .................... | 257/419 |
| 6,229,190 | B1 | * | 5/2001 | Bryzek et al. | ................ | 257/419 |
| 6,384,472 | B1 | * | 5/2002 | Huang | ......................... | 257/680 |
| 7,294,907 | B2 | * | 11/2007 | Minamio et al. | ............ | 257/621 |
| 7,317,199 | B2 | * | 1/2008 | Inoguchi | ..................... | 257/680 |
| 2005/0001219 | A1 | * | 1/2005 | Minamio et al. | .............. | 257/79 |
| 2005/0247992 | A1 | * | 11/2005 | Tsukamoto et al. | ......... | 257/433 |
| 2005/0248009 | A1 | * | 11/2005 | Inoguchi | ..................... | 257/678 |
| 2007/0001102 | A1 | * | 1/2007 | Inoguchi | ................. | 250/214 R |
| 2007/0194439 | A1 | * | 8/2007 | Kawabata | .................... | 257/704 |

FOREIGN PATENT DOCUMENTS

| CN | 1577872 A | 2/2005 |
| EP | 1 494 292 | 6/2004 |
| JP | 11-340257 | 12/1999 |
| JP | 2005-026425 | 1/2005 |
| JP | 3782406 | 3/2006 |
| KR | 10-2005-0004022 | 1/2005 |

* cited by examiner

*Primary Examiner*—John R Lee
(74) *Attorney, Agent, or Firm*—Fish & Richardson P.C.

(57) ABSTRACT

In a circuit device having a circuit element housed in a case, a rise of air pressure and occurrence of condensation in the case are prevented. A circuit device of the present invention includes a case formed of a bottom part and a side part, and a cover part covering an upper surface of the side part. In an internal space of the case, a circuit element such as a semiconductor element is housed. In a bottom part of the case, a land and leads are buried. A communicating part which causes the internal space of the case to communicate with an outside of the case is provided in the land. By providing the communicating part, the rise of air pressure and occurrence of condensation in the internal space due to change in temperature are suppressed. Furthermore, in the land made of metal, the communicating part can be easily formed by etching or the like.

6 Claims, 8 Drawing Sheets

CIRCUIT DEVICE AND METHOD OF MANUFACTURING THE SAME

BACKGROUND OF THE INVENTION

Priority is claimed to Japanese Patent Application Number JP2005-192317 filed on Jun. 30, 2005, the disclosure of which is incorporated herein by reference in its entirety.

1. Field of the Invention

The present invention relates to a circuit device having a circuit element housed in a case, and a method thereof.

2. Description of the Related Art

Figure 8A:
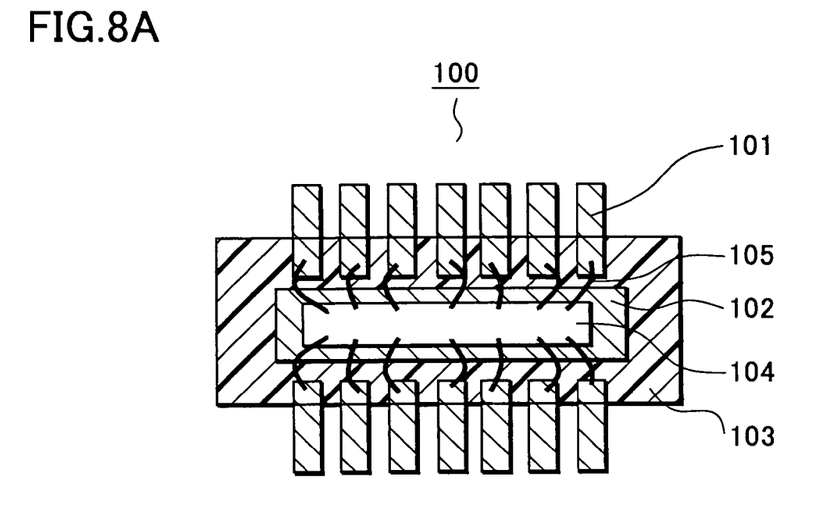
FIG. 8A is a plan view and FIG. 8B is a cross-sectional view describing a conventional circuit device.
Figure 8B:
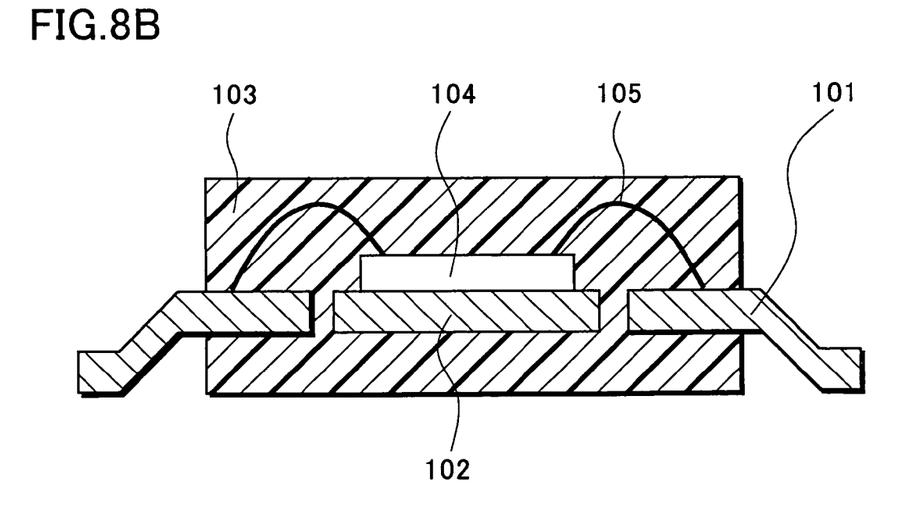

Referring to FIGS. 8A and 8B, a configuration of a conventional circuit device 100 will be described. FIG. 8A is a plan view of the circuit device 100, and FIG. 8B is a cross-sectional view thereof This technology is described for instance in Japanese Patent Application Publication No. Hei 11 (1999)-340257.

Referring to FIGS. 8A and 8B, a land 102 made of a conductive material is formed in a center portion of the circuit device 100, and one end of each of a number of leads 101 is disposed close to a periphery of the land 102. The one end of each of the leads 101 is electrically connected to a semiconductor element 104 through a thin metal wire 105, and the other end thereof is exposed from a sealing resin 103. The sealing resin 103 has a function of integrally supporting the semiconductor element 104, the land 102 and the leads 101 by sealing. Moreover, in the case where an optical element is adopted as the semiconductor element 104, a resin having transparency to light is adopted as the sealing resin 103.

Moreover, as a method of sealing a circuit element such as a semiconductor element, there is also a method other than the resin sealing method. For example, there is also a sealing method of forming a circuit device by forming a case having an internal space by use of metal or a resin material and by housing a circuit element in the internal space. This technology is described for instance in Japanese Patent Application Publication No. 2005-26425.

However, in the case where an element emitting or receiving light with a short wavelength is adopted as the semiconductor element 104 described above, there is a problem that the light causes the sealing resin 103 to undergo a color change and the like. Moreover, since the sealing resin 103, in which a release agent or the like is mixed, has insufficient transparency, there is also a problem that light emitted or received by the semiconductor element is attenuated by the sealing resin 103.

Moreover, in a circuit device having a semiconductor element housed in a case, since a space inside the case is hermetically sealed, an air pressure inside the case is changed in accordance with change in an outside temperature. Accordingly, the housed circuit element may be adversely affected. Furthermore, since the space inside the case is hermetically sealed, change in temperature of an outside atmosphere causes moisture condensation inside the case. Thus, there is a problem that the condensed moisture short-circuits an electric circuit in the case.

SUMMARY OF THE INVENTION

The present invention was made in consideration of the foregoing problems. It is a main object of the present invention to provide a circuit device capable of suppressing deterioration in characteristics of a circuit element housed in a case even if a temperature of an outside atmosphere is changed, and a method of manufacturing the same.

A circuit device of the present invention includes a case having an internal space, a circuit element housed in the internal space, and a conductive member which is buried in the case, which is electrically connected to the circuit element, and which is at least partially exposed to an outside of the case. In the circuit device, a communicating part which causes the internal space to communicate with the outside is provided in the conductive member.

A circuit device of the present invention includes: a case having an internal space; a circuit element housed in the internal space; a land which is buried in a bottom part of the case, and which has the circuit element mounted thereon; a lead which is buried in the bottom part of the case, and which is electrically connected to the circuit element; and a communicating part which is provided in the land, and which causes the internal space to communicate with the outside.

Moreover, a method of manufacturing a circuit device of the present invention includes the steps of forming a case having an internal space and having a conductive member buried therein by injection molding of an insulating resin; and housing a circuit element in the internal space and electrically connecting the circuit element to the conductive member. In the method, a communicating part which causes the internal space to communicate with the outside is provided so as to penetrate the conductive member.

Furthermore, a method of manufacturing a circuit device of the present invention includes the steps of preparing a lead frame which includes a land and a lead having one side positioned close to the land, and which has a provided communicating part penetrating the land; forming a case including a bottom part, in which the lead and the land are buried, and a side part by injection molding of an insulating resin, and exposing at least part of the land and the lead from upper and lower surfaces of the bottom part; fixing a circuit element to an upper surface of the land and electrically connecting the lead to the circuit element; and adhering a cover part to an upper surface of the side part.

DESCRIPTION OF THE EMBODIMENTS

Figure 1A:
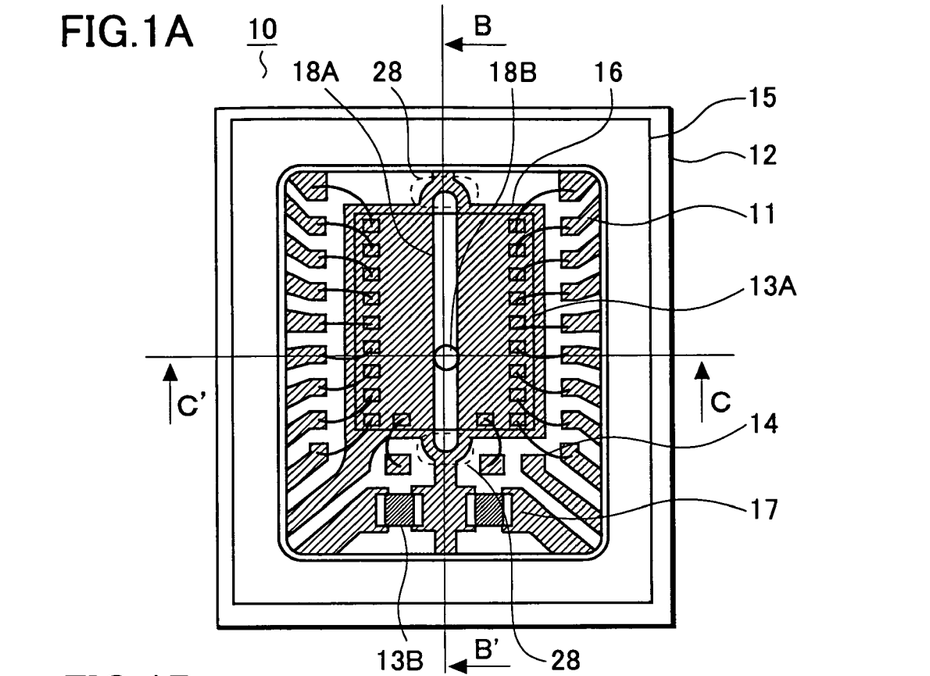
FIG. 1A is a plan view and FIGS. 1B and 1C are cross-sectional views describing a circuit device of an embodiment of the present invention.
Figure 1B:
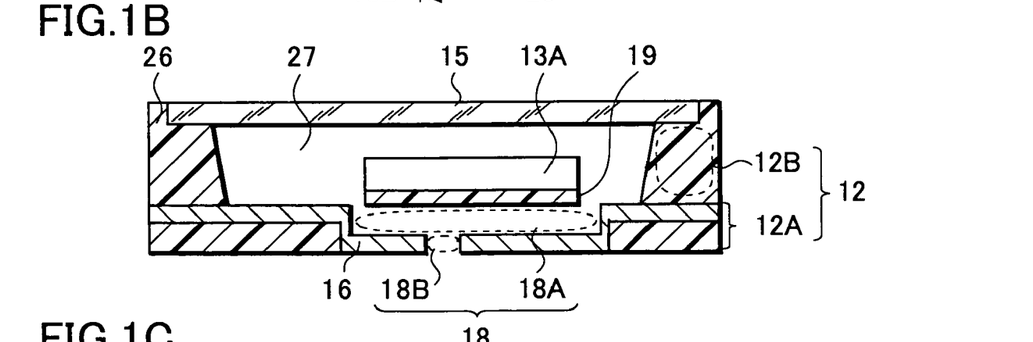
Figure 1C:
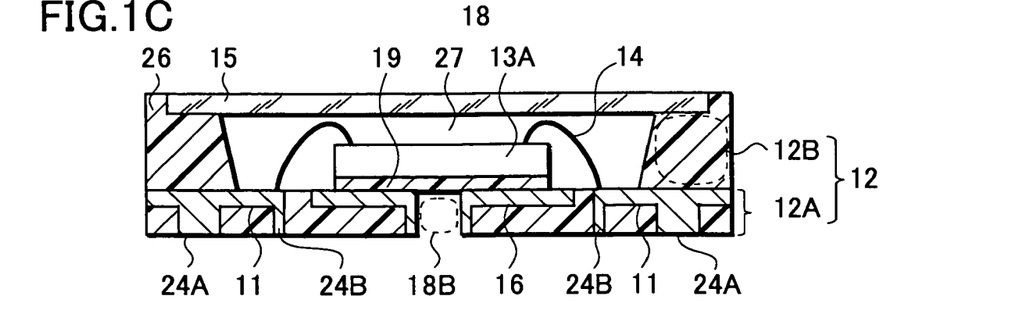

Referring to FIGS. 1A to 1C, a specific configuration of a circuit device 10 of an embodiment of the present invention will be described. FIG. 1A is a plan view of the circuit device 10, FIG. 1B is a cross-sectional view thereof along the line B-B' in FIG. 1A, and FIG. 1C is a cross-sectional view thereof along the line C-C' in FIG. 1A.

In the circuit device 10 of this embodiment, an upper surface of a case 12 formed of a bottom part 12A and a side part 12B is covered with a cover part 15. Thus, an internal space 27 is formed, in which a circuit element such as a semiconductor element 13A is housed. A land 16 and leads 11 are buried in the bottom part 12A, each of which has upper and rear surfaces partially exposed from the bottom part 12A. In this embodiment, a communicating part 18 which causes the internal space 27 to communicate with an outside of the internal space 27 is provided in the land 16. The circuit device 10 of this embodiment will be described in detail below.

Referring to FIGS. 1A and 1B, the case 12 is formed by integrally molding the plate-like bottom part 12A and the frame-shaped side part 12B by use of an insulating resin 26. The land 16 is buried in a center portion of the bottom part 12A, and a number of the leads 11 are buried so that each of the leads 11 has one end disposed close to the land 16. An inner wall of the side part 12B is tilted to the bottom part 12A in consideration of removal of a mold die in a mold step.

The leads 11 are buried in the bottom part 12A. Each of the leads 11 has one end positioned close to the land 16 and the other end extended to a peripheral part of the circuit device 10. Referring to FIG. 1C, upper surfaces of the leads 11 are exposed to the internal space 27 of the case 12 and are electrically connected to a semiconductor element 13A through thin metal wires 14. Moreover, rear surfaces of the leads 11 are exposed from the bottom part 12A and form exposed parts 24A and 24B. The exposed part 24A functions as an external connection electrode for the entire circuit device 10. Moreover, the exposed part 24B suppresses occurrence of resin burr by coming into contact with the mold die in the mold step of forming the case 12. Furthermore, the exposed part 24B prevents attenuation of ultrasonic energy applied to the leads 11 by coming into contact with a workbench in a step of forming the thin metal wires 14. Such a cross-sectional shape of the lead 11 can be formed by half-etching.

Moreover, referring to FIG. 1A, by partially increasing a width of the lead 11, a pad 17 is formed. Two chip elements 13B are fixed to the pads 17.

The land 16 is disposed near a center portion of the circuit device 10, and the semiconductor element 13A is fixed thereon. A planar size of the land 16 is set to be the same as that of the semiconductor element 13A or more. Referring to FIG. 1C, the land 16 is subjected to half-etching as in the case of the leads 11, and a rear surface of the land 16 is partially exposed to the outside from the bottom part 12A. Specifically, the rear surface of the land 16 is partially covered with the insulating resin 26 which forms the bottom part 12A. Thus, adhesion strength between the land 16 and the insulating resin 26 which forms the bottom part 12A is improved. Consequently, the land 16 is prevented from falling off from the bottom part 12A. Moreover, the communicating part 18, which causes the internal space 27 to communicate with the outside, is formed in the land 16. The communicating part 18 will be described in detail later.

On the exposed surfaces of the land 16 and the leads 11, a plated film made of Ni/Au is formed to improve bonding properties. Moreover, as a material of the land 16 and the leads 11, metal mainly made of copper (Cu), metal mainly made of aluminum (Al) or 42 alloy is adopted. Herein, 42 alloy is an alloy containing 42% of nickel and 58% of iron.

In this embodiment, the circuit elements including the semiconductor element 13A and the chip elements 13B are housed in the case 12. The semiconductor element 13A is fixed to the upper surface of the land 16 with an adhesive 19 interposed therebetween. Moreover, the semiconductor element 13A is electrically connected to the leads 11 through the thin metal wires 14. The chip elements 13B are chip-type circuit elements such as a chip condenser and a chip resistor, and are fixed to the pads 17 by use of solder or conductive paste.

As the semiconductor element 13A, an image sensor such as a CCD and a CMOS, a light emitting diode, a semiconductor laser or the like is adopted. Moreover, an element which emits or receives a high-frequency blue laser having a wavelength of about 405 nm can be adopted as the semiconductor element 13A.

The chip elements 13B and the semiconductor element 13A are electrically connected to each other through the leads 11 in the circuit device 10. Therefore, a distance between each of the chip elements 13B and the semiconductor element 13A can be shortened. Moreover, in the case where the chip elements 13B are condensers for reducing noise, a noise reduction effect can be enhanced.

As the adhesive 19 used for fixing the semiconductor element 13A, a die attach sheet is preferable. This is because, when an adhesive of which viscosity is lowered in a step of performing die bonding is used, there is a risk that a groove part 18A is filled with the adhesive. Meanwhile, by using the die attach sheet, the risk described above can be eliminated since the sheet is never liquefied even in the step of performing die bonding.

The cover part 15 serves to seal an opening of the side part 12B from above. As a material thereof, a material having transparency to light received or emitted by the semiconductor element 13A is adopted. For example, in the case where the semiconductor element 13A is the element which emits or receives the high-frequency blue laser having a wavelength of about 405 nm, a material having transparency to the blue laser is adopted as the cover part 15. As an example, glass is a suitable material of the cover part 15. Moreover, the cover part 15 is attached to the case 12 by use of an insulating adhesive. Herein, the entire device can also be configured without the cover part 15. Since glass which is the material of the cover part is a very expensive material, overall manufacturing costs can be reduced by adopting the configuration without the cover part.

The point of this embodiment is that the communicating part 18 is provided, which causes the internal space 27 of the circuit device 10 to communicate with the outside. By providing the communicating part 18 and causing the internal space 27 to communicate with the outside, it is possible to suppress an air pressure increase and occurrence of condensation in the internal space 27.

In this embodiment, the communicating part 18 is formed in the land 16 which is a conductive member. Since etching or punching can be performed for the land 16 made of metal such as 42 alloy, the communicating part 18 can be formed relatively easily. Particularly, in the case where the communicating part 18 is provided in the land 16 by etching, the communicating part 18 having a desired shape can be formed in an arbitrary spot only by changing a shape of an etching mask. Moreover, an inner wall of the communicating part 18 is roughened by etching or the like. Accordingly, dust coming in from the outside is actively trapped by the inner wall of the communicating part 18. Thus, it is possible to suppress entering of the dust into the device.

Meanwhile, it is also possible to provide the communicating part 18 in the insulating resin 26 which forms the case 12. However, in this case, it is required to prepare a mold die corresponding to a shape of the communicating part 18 to be formed. Accordingly, the costs are significantly increased. Therefore, it is preferable that the communicating part 18 be formed in the land 16 or the lead 11, which is made of metal.

Referring to FIGS. 1A and 1B, the communicating part 18 includes the groove part 18A provided in a groove shape on the surface of the land 16, and a communicating hole 18B provided so as to penetrate the land 16 in a portion where the groove part 18A is provided. By covering an upper surface of the groove part 18A with the semiconductor element 13A, a path of the communicating part 18 is formed. Moreover, by extending a part of the groove part 18A so as to protrude from a region where the semiconductor element 13A is mounted, the communicating part 18 is set in a state of being able to communicate with the internal space 27. In FIG. 1A, upper and lower ends of one linearly extended groove part 18A are extended so as to protrude from the region where the semiconductor element 13A is mounted. Accordingly, the path of the communicating part 18 can be longer. Thus, even if dust enters into the communicating part 18 from the outside, the dust is trapped by the inner wall of the communicating part 18, and entering of the dust into the internal space 27 is suppressed.

Moreover, by providing the communicating part 18 in the land 16 in the region where the semiconductor element 13A is mounted, it is not required to separately secure a region for forming the communicating part 18. Thus, the communicating part 18 can be formed without increasing the size of the circuit device 10.

Furthermore, in the embodiment of the present invention, protruding parts 28 protruding around the rectangular land 16 are provided, and the groove part 18A is extended to the protruding parts 28 below the semiconductor element 13A. Thus, the groove part 18A can be extended so as to protrude from the region therebelow where the semiconductor element 13A is mounted without increasing the size of the land 16. Specifically, in order to cause the groove part 18A to communicate with the internal space 27, it is required that the groove part 18A formed on the surface of the land 16 is formed so as to protrude from the region where the semiconductor element 13A is mounted. However, if the entire land 16 is increased in size in order to form such the groove part 18A, the size of the circuit device is increased. Therefore, in this embodiment, the protruding parts 28 are provided in a peripheral part of the land 16, and the groove part 18A is extended on surfaces of the protruding parts 28. Accordingly, only the protruding parts 28, on which the groove part 18A is provided, protrude outside. Thus, it is possible to suppress an increase in area of the entire land 16.

Figure 2:
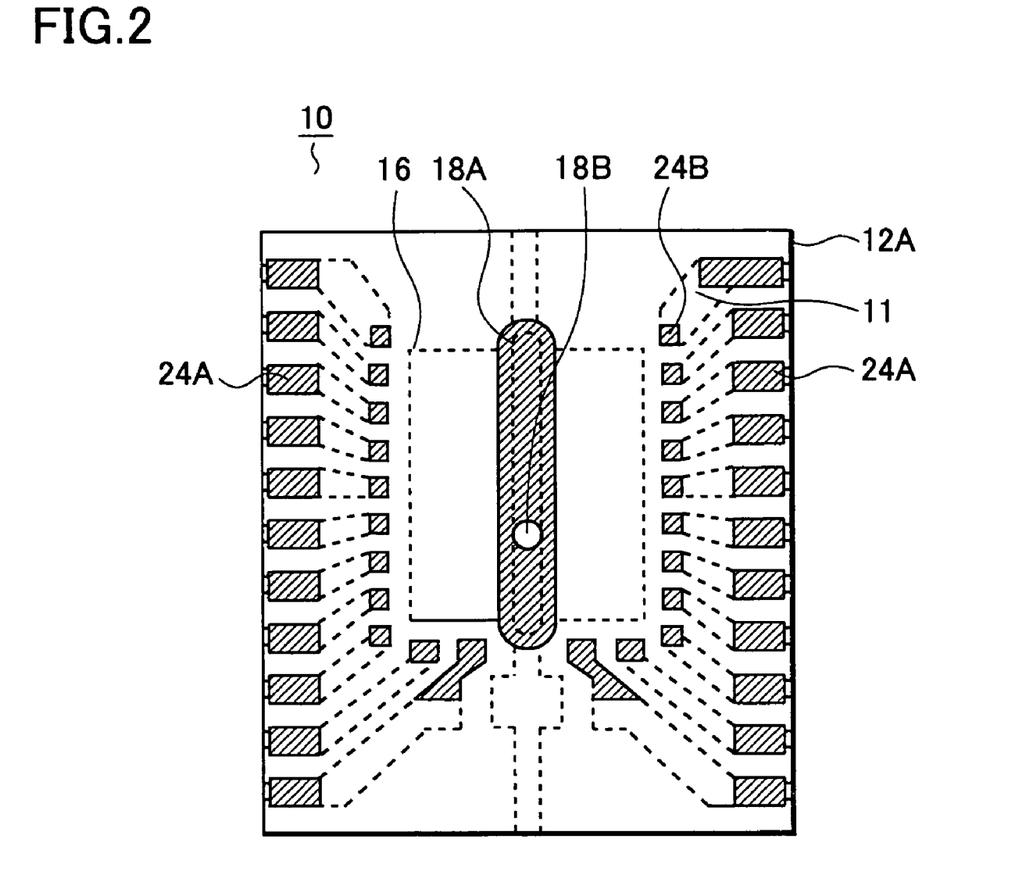
FIG. 2 is a plan view describing the circuit device of the embodiment of the present invention.

FIG. 2 is a plan view of the circuit device 10 at a time when viewed from a rear surface thereof. In FIG. 2, the leads 11 in portions exposed to the outside are indicated by shaded hatching, and the leads 11 in portions not exposed to the outside are indicated by dotted lines.

By partially exposing the surface of the lead 11 from the bottom part 12A, the exposed parts 24A and 24B are formed.

The exposed part 24A is formed of the lead 11 exposed in the peripheral part of the circuit device 10. A plurality of the exposed parts 24A are provided in line in the peripheral part, and a planar size thereof is, for example, about 0.5 mm×0.3 mm, which enables attachment of solder or conductive paste thereon. Moreover, in order to prevent solder and the like deposited on rear surfaces of the exposed parts 24A from short-circuiting each other, the exposed parts 24A are separated from each other. A specific distance by which the exposed parts 24A are separated from each other is, for example, about 0.2 mm.

The exposed part 24B is formed of the lead 11 exposed to the rear surface in the vicinity of the land 16. The upper surface of the lead 11 in a portion where the exposed part 24B is positioned is exposed to the inside of the case and is connected to the semiconductor element 13A through the thin metal wire 14 as shown in FIG. 1C. The exposed part 24B is provided for preventing attenuation of ultrasonic energy in wire bonding. Meanwhile, the exposed part 24B may be used as an external connection electrode by adhering solder or the like to a rear surface of the exposed part 24B.

The rear surface of the land 16 in portions where the groove part 18A and the communicating hole 18B are provided is exposed to the outside, and the other regions thereof is covered with the insulating resin. The partially exposed rear surface of the land 16 can also be used as the external connection electrode.

Figure 3:
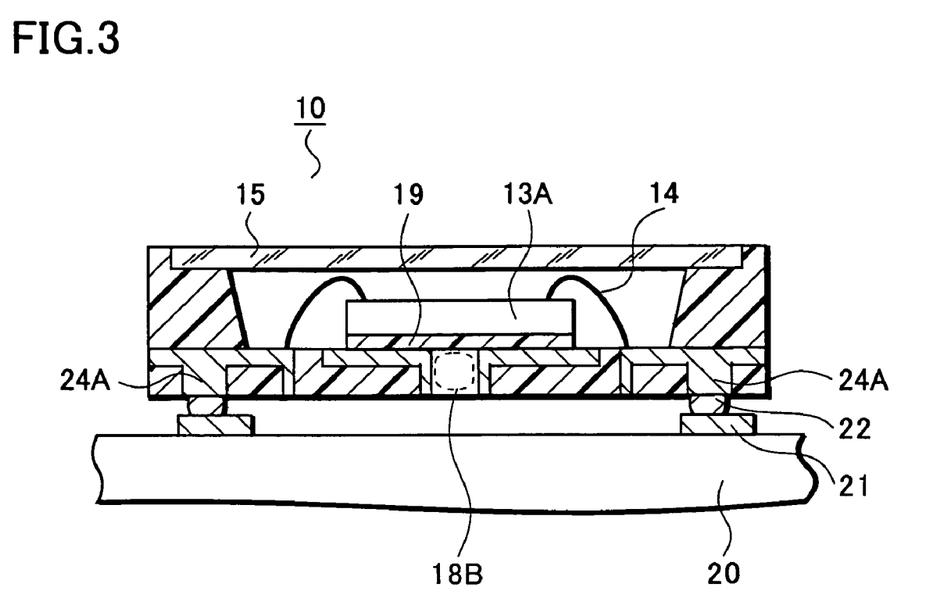
FIG. 3 is a cross-sectional view describing the circuit device of the embodiment the present invention.

Referring to a cross-sectional view of FIG. 3, a mounting structure of the circuit device 10 having the configuration described above will be described. Referring to FIG. 3, a connection electrode 22 made of solder or conductive paste is welded to adhere to the exposed part 24A exposed to the rear surface of the circuit device 10. Thus, the circuit device 10 is fixed to a conductive path 21 on a mounting substrate 20. Herein, by use of wettability of the exposed part 24A, a shape and a position of the connection electrode 22 are controlled. Thus, a risk of short-circuiting due to solder bridge is eliminated. Moreover, the rear surface of the circuit device 10 and a front surface of the mounting substrate 20 are separated from each other by the connection electrode 22. Therefore, the communicating hole 18B is not sealed by the mounting substrate 20, and the internal space of the circuit device 10 is set in a state of communicating with the outside.

Referring to FIGS. 4 to 7, a method of manufacturing a circuit device 10 described above will be described.

Figure 4A:
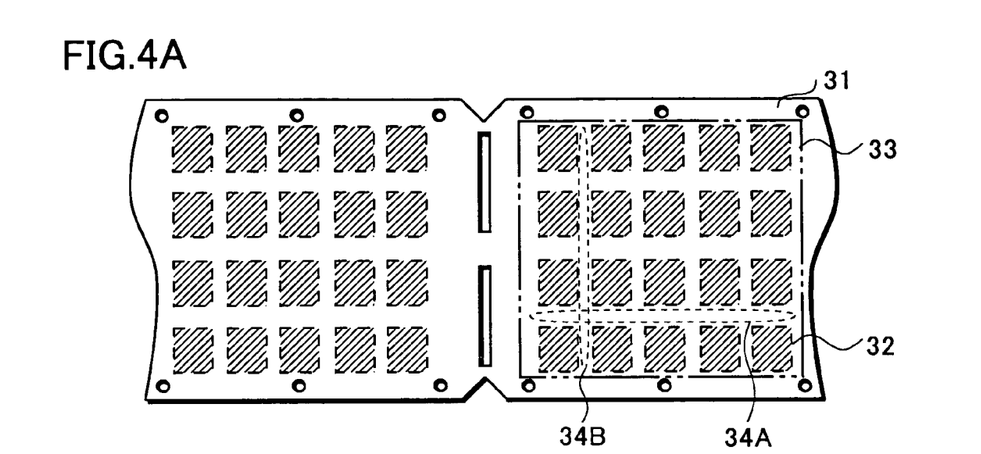
FIGS. 4A and 4B are plan views and FIG. 4C is a cross-sectional view describing a method of manufacturing a circuit device of the embodiment of the present invention.
Figure 4B:
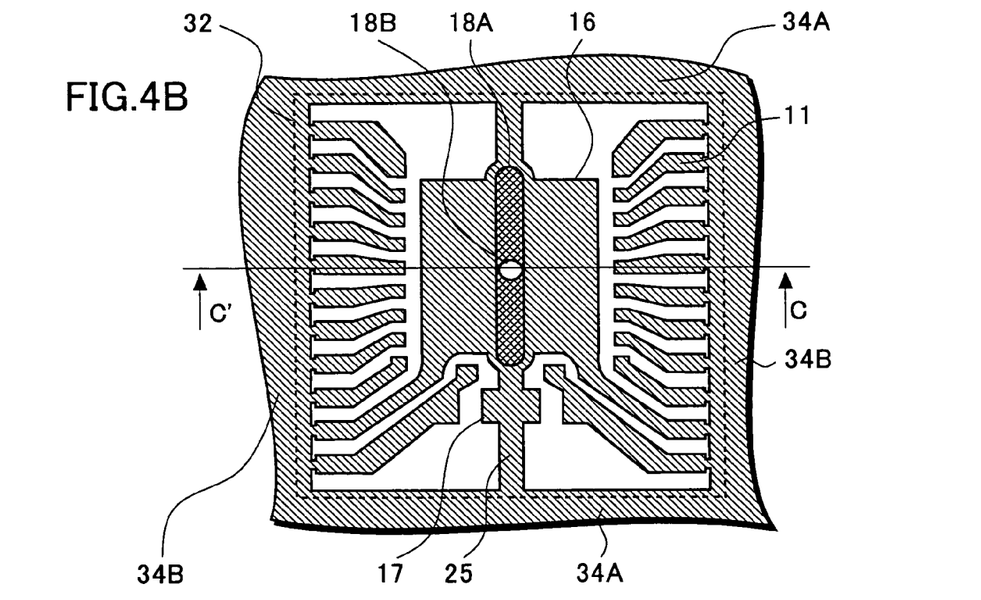
Figure 4C:
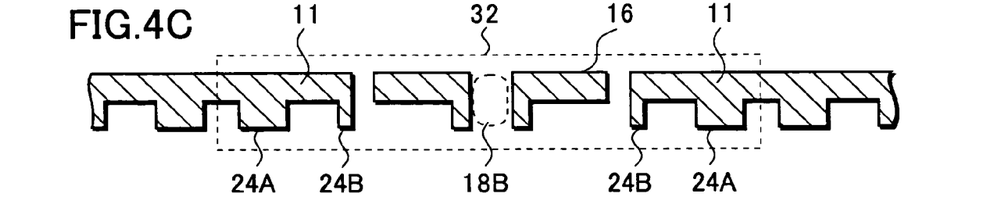

First, referring to FIGS. 4A to 4C, a lead frame 31 including units 32 is formed. Specifically, each of the units 32 includes leads 11 and a land 16. FIG. 4A is a plan view of the lead frame 31, FIG. 4B is a plan view of the unit 32, and FIG. 4C is a cross-sectional view of the unit 32 along the line C-C' in FIG. 4B.

Referring to FIG. 4A, the lead frame 31 is formed by processing one plate-like metal plate. In the strip-shaped lead frame 31, several separate blocks 33 are disposed. In each of the blocks 33, a number of the units 32 are formed in a matrix. Herein, the "unit" means an element unit which forms one circuit device.

As a material of the lead frame 31, metal mainly made of copper (Cu), metal mainly made of aluminum (Al) or 42 alloy is adopted. As a method of processing the lead frame 31, etching or punching can be adopted. Particularly, by adopting etching, costs required for processing are reduced. Moreover, the lead frame 31 can be partially removed in a thickness direction by half-etching.

The units 32 are connected to each other by first connection parts 34A extended in a horizontal direction and second connection parts 34B extended in a vertical direction within the block 33.

Referring to FIG. 4B, a specific configuration of the unit 32 will be described. The unit 32 includes the land 16 disposed in a center portion of the unit 32, and the leads 11 each having one end positioned close to the land 16. The land 16 is connected to the first connection parts 34A, which are positioned at upper and lower ends on the page, by use of a hanging lead 25. Moreover, one end of each of the leads 11 is connected to any of the second connection parts 34B, the second connection parts 34B positioned at left and right ends on the page. The other end of each of the leads 11 is extended to the vicinity of the land 16. In order to suppress occurrence of burr in a subsequent separation step, each of connection portions between the leads 11 and the second connection parts 34B is formed to have a width narrower than that of the lead 11 in the other region. Furthermore, by partially increasing the width of the lead 11, a pad 17 is formed, on which a chip element is mounted.

In this step, a groove part 18A and a communicating hole 18B are formed in the land 16. The groove part 18A is a groove-shaped region provided in a surface of the land 16 by half-etching. The communicating hole 18B is a portion provided so as to penetrate the land 16 in the portion where the groove part 18A is formed. In this embodiment, the groove part 18A and the communicating hole 18B can be simultaneously formed by etching for forming the land 16 and the leads 11. Therefore, the groove part 18A and the communicating hole 18B are formed without increasing the number of steps.

Referring to FIG. 4C, in the leads 11, exposed parts 24A protruding convexly downward are formed in a peripheral part of the unit 32. Moreover, exposed parts 24B protruding downward are also formed near tips of the leads 11. A rear surface of each of the exposed parts 24A functions as an external connection terminal of the entire circuit device. Each of the exposed parts 24B has a function of fixing the tip of the lead 11 in a thickness direction in manufacturing steps. A specific function of the exposed part 24B will be described later.

Figure 5A:
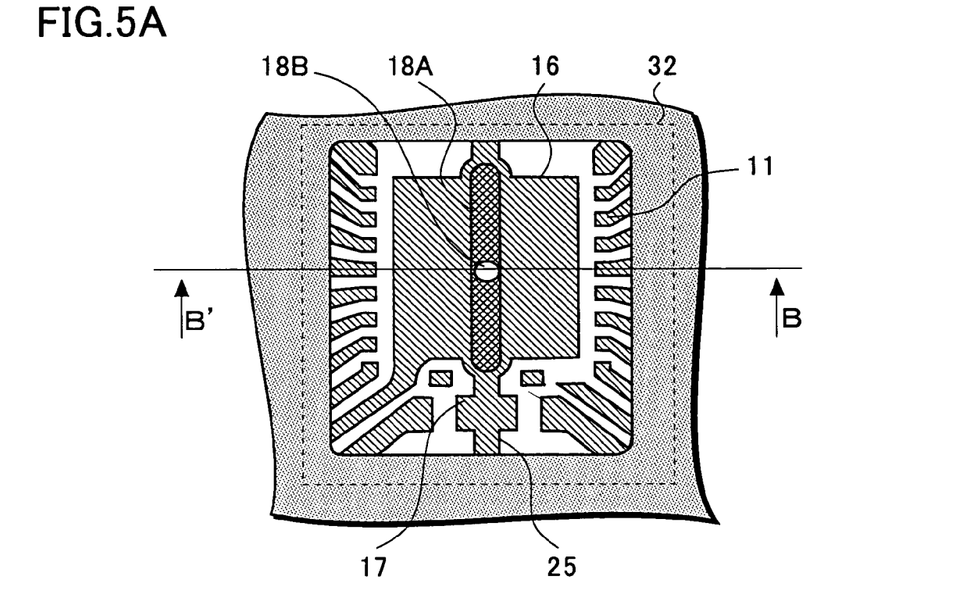
FIG. 5A is a plan view and FIG. 5B is a cross-sectional view describing the method of manufacturing a circuit device of the embodiment of the present invention.
Figure 5B:
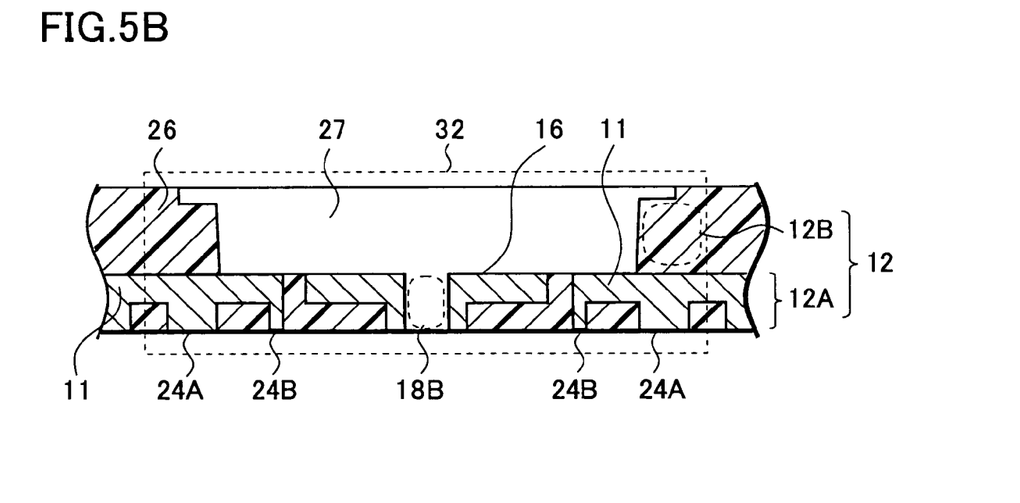

Next, referring to FIGS. 5A and 5B, a case 12 including a bottom part 12A and a side part 12B, which are integrated, is formed by injection molding of an insulating resin 26. FIG. 5A is an enlarged plan view of the unit 32, and FIG. 5B is a cross-sectional view of the unit 32 along the line B-B' in FIG. 5A.

In this step, the insulating resin 26 is formed by injection molding using a mold. To be more specific, first, lower surfaces of the leads 11 are caused to come into contact with a lower mold (not shown) and an upper mold (not shown) having a shape corresponding to an internal space 27 of the case 12 is caused to come into contact with upper surfaces of the leads 11. In this state, the insulating resin 26 is injected into the mold (not shown). Thus, the case 12 including the bottom part 12A and the side part 12B is formed. Because of this step, the leads 11 and the land 16 are buried in the insulating resin 26 which forms the bottom part 12A. The upper and lower surfaces of the leads 11 are partially exposed from the bottom part 12A. The upper surfaces of the leads 11 are exposed to the internal space 27 from the bottom part 12A and are electrically connected to a semiconductor element to be mounted, and the like. Moreover, the exposed parts 24A and 24B provided in lower parts of the leads 11 are exposed to an outside from the bottom part 12A. As to the land 16, almost the entire surface thereof is exposed from the bottom part 12A and the rear surface thereof is partially exposed to the outside from the bottom part 12A.

In this step, by providing the exposed parts 24B near the tips of the leads 11, attachment of the insulating resin 26 to the surfaces of the leads 11 is suppressed. To be more specific, in this step, the upper surfaces of the leads come into contact with the upper mold. Moreover, the exposed parts 24B provided near the tips of the leads 11 come into contact with the lower mold. Therefore, the tips of the leads 11 are pressed in the thickness direction by the lower and upper molds. Thus, resin burr is suppressed, which is caused by the insulating resin 26 entering between the leads 11 and the upper mold. Moreover, even if the resin burr occurs, an amount thereof is small. Thus, the resin burr can be easily removed by means of high-pressure cleaning. In this step, injection molding using a thermoplastic resin or transfer molding using a thermosetting resin is performed.

After this step is finished, the exposed surfaces of the land 16 and the leads 11 are covered with a plated film. In this step, the leads 11 and the lands 16 in the respective units formed in the lead frame are all electrically connected to each other. Therefore, electrolytic plating can be easily performed for the respective lands 16 and the leads 11. To be more specific, the exposed surfaces of the leads 11 and the land 16 are covered with a nickel (Ni) film and a gold (Au) film formed thereon. Thus, bonding properties are improved.

Figure 6A:
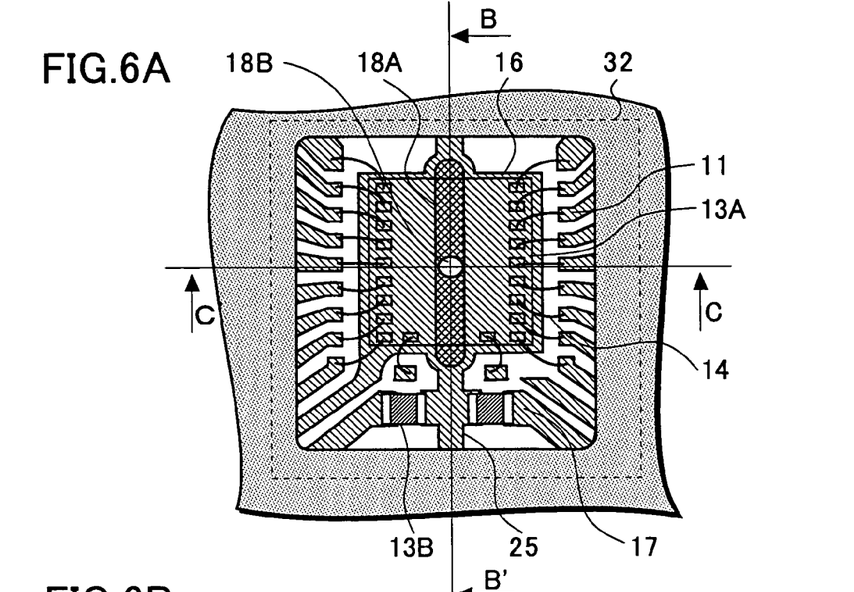
FIG. 6A is a plan view and FIGS. 6B and 6C are cross-sectional views describing the method of manufacturing a circuit device of the embodiment of the present invention.
Figure 6B:
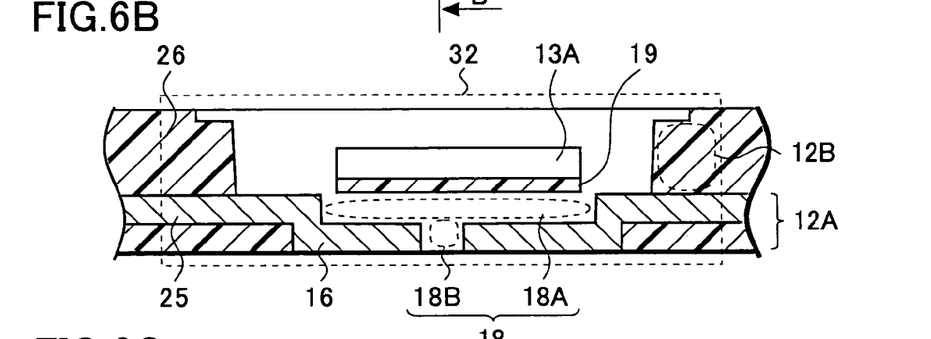
Figure 6C:
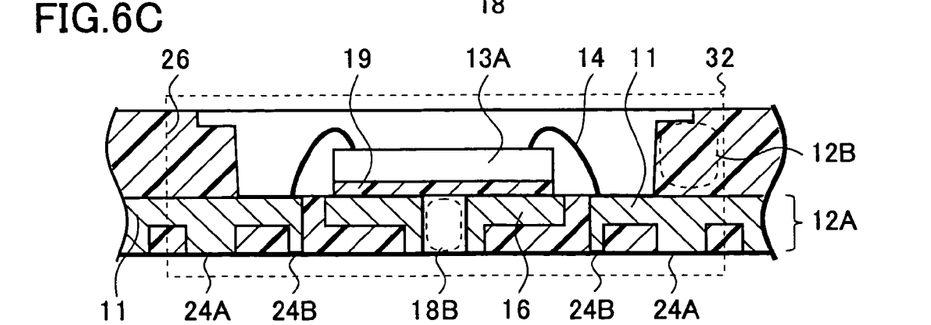

Next, referring to FIGS. 6A to 6C, circuit elements such as a semiconductor element 13A are mounted in each unit 32. FIG. 6A is an enlarged view of the unit 32, FIG. 6B is a cross-sectional view thereof along the line B-B' in FIG. 6A, and FIG. 6C is a cross-sectional view thereof along the line C-C' in FIG. 6A.

Referring to FIG. 6A, the semiconductor element 13A is fixed onto the land 16. Electrodes formed on a surface of the semiconductor element 13A are electrically connected to the leads 11 through thin metal wires 14. Moreover, a chip element 13B is fixed to the pad 17 by use of a solder material.

Referring to FIGS. 6B and 6C, the semiconductor element 13A is fixed to the upper surface of the land 16 by use of an adhesive 19. Herein, as the adhesive 19, one which is never liquefied in a step of performing die bonding is preferable. If an adhesive that is liquefied when die bonding is performed is used, there is a risk that the liquefied adhesive seals the communicating hole 18B. As the adhesive 19, a film die attach sheet is preferable, which is never liquefied even when heated during die bonding. Moreover, it is also possible to use an adhesive other than the die attach sheet as long as the adhesive is not liquefied under a temperature condition during die bonding. Herein, as the semiconductor element 13A, an optical semiconductor element which emits or receives light can be adopted.

In formation of the thin metal wires 14, the exposed parts 24B provided near the tips of the leads 11 come into contact with a workbench. Therefore, by causing the exposed parts 24B to come into contact with the workbench, positions of the tips of the leads 11 are fixed. Thus, ultrasonic energy is not dispersed when the thin metal wires 14 are connected to the upper surfaces of the leads 11. Consequently, connection reliability between the leads 11 and the thin metal wires 14 can be improved.

Figure 7A:
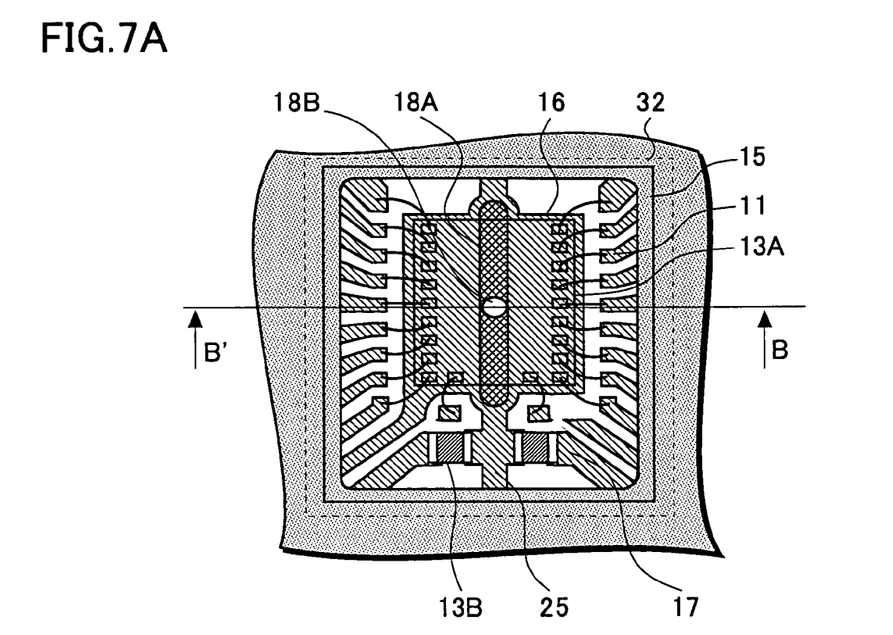
FIG. 7A is a plan view and FIG. 7B is a cross-sectional view describing the method of manufacturing a circuit device of the embodiment of the present invention.
Figure 7B:
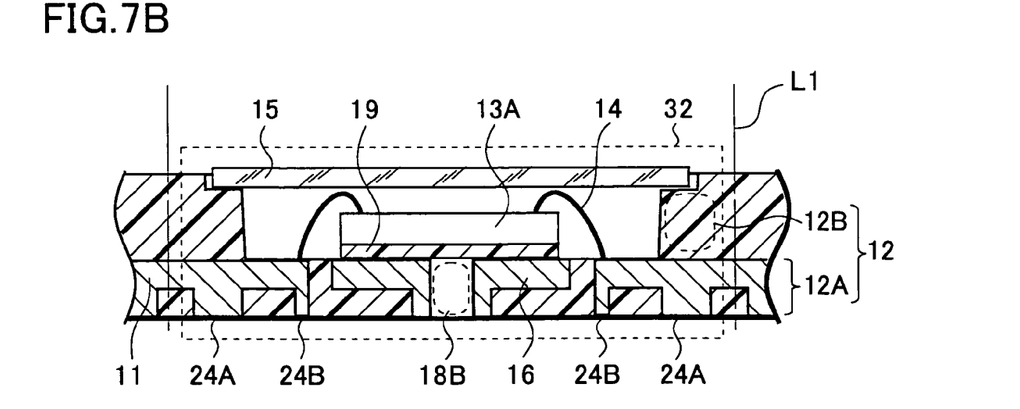

Next, referring to FIGS. 7A and 7B, an opening of the case 12 is sealed by adhering a cover part 15 to each unit 32. FIG. 7A is an enlarged view of the unit 32 and FIG. 7B is a cross-sectional view thereof along the line B-B' in FIG. 7A.

As the cover part 15, a material (for example, glass) having transparency to light received or emitted by the semiconductor element 13A can be adopted. Moreover, if the semiconductor element 13A is not the optical semiconductor element, the cover part 15 made of a light blocking material may be adopted. The cover part 15 is attached to the upper part of the case 12 by use of an adhesive.

After attachment of the cover part 15 is finished, the units 32 are separated from each other on a split line L1 indicated by a dashed line. Thus, each circuit device is obtained. This separation can be performed by a separation method using dicing or a laser. Moreover, the leads 11 in portions separated by dicing or the like have a thickness reduced by half-etching. Thus, occurrence of burr in separation is suppressed.

According to the circuit device of the embodiment of the present invention, the communicating part which causes the inside of the case to communicate with the outside is formed in the conductive member such as the land buried in the case. Accordingly, change in air pressure and condensation inside the case are suppressed. Thus, deterioration in characteristics of the circuit element housed in the case can be prevented.

Moreover, the communicating part is formed of a groove part provided in a groove shape on the surface of the land, and a communicating hole penetrating the land. Accordingly, a path of the communicating part can be longer. Thus, it is possible to prevent dust from entering into the case from the outside through the communicating part.

Furthermore, by forming the communicating part in the conductive member such as the land, an inner wall of the communicating part can be easily roughened by etching or the like. Accordingly, the dust is trapped by the roughened inner wall of the communicating part. Thus, entering of the dust into the case can be suppressed.

According to the method of manufacturing a circuit device of the embodiment of the present invention, the communicating part is provided in the conductive member such as the land, which can be easily processed by etching or punching. Thus, costs required for formation of the communicating part can be reduced. Furthermore, in the conductive member such as the land, the communicating part can also be formed in an arbitrary spot.

What is claimed is:

1. A circuit device comprising:
   a case having an internal space;
   a circuit element in the internal space;
   a conductive member buried in the case, wherein the conductive member is electrically connected to the circuit element, and wherein the conductive member is at least partially exposed to an outside of the case;
   a protruding part in a peripheral portion of the conductive member, wherein the protruding part protrudes outward from the conductive member and beyond an edge of the circuit element; and
   a groove part in the conductive member and beneath the circuit element, wherein the groove part extends to the protruding part beyond the edge of the circuit element; and
   a communicating part in the conductive member which causes the internal space to communicate with the outside through the groove part.

2. A circuit device comprising:
   a case having an internal space;
   a circuit element in the internal space;
   a land buried in a bottom part of the case, and which has the circuit element mounted thereon;
   a lead buried in the bottom part of the case, wherein the lead is electrically connected to the circuit element;
   a communicating part in the land, wherein the communicating part causes the internal space to communicate with an outside of the case;
   a groove part, having a groove shape, in a surface of the land facing the internal space, which continuously extends to an end of a region where the circuit element is disposed;
   a communicating hole that penetrates the land in a region of the groove part; and
   a protruding part in a peripheral portion of the land which protrudes outwardly from the land, wherein the groove part extends to the protruding part beyond an edge of the circuit element.

3. The circuit device according to claim 2, wherein
   the circuit element is a semiconductor element,
   the semiconductor element is mounted face up on the land, and
   the semiconductor element and the lead are electrically connected to each other through a thin metal wire.

4. The circuit device according to claim 2, wherein the case comprises an insulating resin on a lower surface of the land.

5. The circuit device according to claim 2, wherein a semiconductor element and a chip condenser, which are electrically connected to each other, are the circuit element.

6. The circuit device according to claim 1 or 2, wherein
   the circuit element is a semiconductor element which receives or emits light, and
   the case includes a bottom part and a side part, which are integrally formed, and a cover part which is mounted on an upper surface of the side part and transmits the light.

* * * * *